(12) United States Patent
Nagai et al.

(10) Patent No.: US 8,723,626 B2
(45) Date of Patent: May 13, 2014

(54) ELECTROMAGNETIC RESONANCE COUPLER

(71) Applicant: Panasonic Corporation, Osaka (JP)

(72) Inventors: Shuichi Nagai, Osaka (JP); Susumu Maruno, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/061,843

(22) Filed: Oct. 24, 2013

(65) Prior Publication Data

US 2014/0049338 A1    Feb. 20, 2014

Related U.S. Application Data

(63) Continuation of application No. PCT/JP2013/000425, filed on Jan. 28, 2013.

(30) Foreign Application Priority Data

Feb. 29, 2012 (JP) ................................ 2012-044456

(51) Int. Cl.
*H01P 7/00*   (2006.01)
*H01L 41/00*   (2013.01)

(52) U.S. Cl.
USPC ........................................... 333/219; 310/320

(58) Field of Classification Search
USPC ........... 333/202, 204, 24 C, 24 R, 219, 219.1; 310/320
See application file for complete search history.

(56) References Cited

U.S. PATENT DOCUMENTS

| 4,939,403 | A | * | 7/1990 | Kittaka et al. | ................ 310/320 |
| 5,045,744 | A | * | 9/1991 | Ando et al. | ................... 310/320 |
| 5,061,910 | A | | 10/1991 | Bouny | |
| 7,072,636 | B2 | | 7/2006 | Dobrovolny | |
| 7,302,249 | B1 | | 11/2007 | Fudem et al. | |
| 8,552,821 | B2 | * | 10/2013 | Nagai | .......................... 333/219 |

FOREIGN PATENT DOCUMENTS

| JP | 63-173401 | 7/1988 |
| JP | 03-237801 | 10/1991 |
| JP | 08-242106 | 9/1996 |
| JP | 08-265048 | 10/1996 |
| JP | 08-279707 | 10/1996 |
| JP | 09-036667 | 2/1997 |
| JP | 2008-219081 | 9/2008 |

OTHER PUBLICATIONS

International Search Report issued Apr. 23, 2013 in International (PCT) Application No. PCT/JP2013/000425.

* cited by examiner

*Primary Examiner* — Dean O Takaoka
(74) *Attorney, Agent, or Firm* — Wenderoth, Lind & Ponack, LLP.

(57) ABSTRACT

An electromagnetic resonance coupler including: a transmitting resonator provided on a transmission substrate and having an open loop shape having an opening, first wiring provided on the transmission substrate and connected to a first connection point on the transmitting resonator, a receiving resonator provided on the reception substrate, second wiring provided on the reception substrate and connected to a second connection point on the receiving resonator, and third wiring provided on the reception substrate and connected to a third connection point on the receiving resonator. When viewed in a direction perpendicular to a main surface of the transmission substrate, the transmission substrate and the reception substrate are provided facing each other so that the transmitting resonator and the receiving resonator are symmetric about a point and have matching contours.

12 Claims, 8 Drawing Sheets

ELECTROMAGNETIC RESONANCE COUPLER

CROSS REFERENCE TO RELATED APPLICATIONS

This is a continuation application of PCT International Application No. PCT/JP2013/000425 filed on Jan. 28, 2013, designating the United States of America, which is based on and claims priority of Japanese Patent Application No. 2012-044456 filed on Feb. 29, 2012. The entire disclosures of the above-identified applications, including the specifications, drawings and claims are incorporated herein by reference in their entirety.

FIELD

One or more exemplary embodiments disclosed herein relate generally to electromagnetic resonance couplers that transmit the electrical energy of high frequency signals wirelessly.

BACKGROUND

Rat race circuits (for example, patent literature (PTL) 1), which convert one high frequency signal (single-ended signal) into two equal amplitude, anti-phase differential signals, are widely used as a structural element in, for example, microwave band frequency converters. Use of such a rat race circuit makes it possible to amplify each of the differential signals by amplifying the single-ended signal with one amplifier.

CITATION LIST

Patent Literature

[PTL 1] Japanese Unexamined Patent Application Publication No. H8-279707

SUMMARY

Technical Problem

Miniaturization is problematic with single-ended to differential converters which split a single-ended signal into two equal amplitude, anti-phase differential signals, such as the rat race circuit described above.

One non-limiting and exemplary embodiment disclosed herein provides a single-ended to differential converter capable of being miniaturized.

Solution to Problem

In order to overcome the aforementioned problem, an electromagnetic resonance coupler according to an aspect of an exemplary embodiment for transmitting a high frequency signal between first resonant wiring and second resonant wiring wirelessly, the electromagnetic resonance coupler including: a first substrate; a second substrate facing the first substrate; the first resonant wiring provided on the first substrate and having an open loop shape having an opening; first input/output wiring provided on the first substrate and connected to a first connection point on the first resonant wiring; the second resonant wiring provided on the second substrate and having a same wiring width and shape as a wiring width and shape of the first resonant wiring; second input/output wiring provided on the second substrate and connected to a second connection point positioned on the second resonant wiring a predetermined distance away from a first end of the second resonant wiring; and third input/output wiring provided on the second substrate and connected to a third connection point positioned on the second resonant wiring the predetermined distance away from a second end of the second resonant wiring, wherein when viewed in a direction perpendicular to a main surface of the first substrate, the first resonant wiring and the second resonant wiring are symmetric about a point and have matching contours, and when the high frequency signal is inputted to the electromagnetic resonance coupler, an electrical energy level at the second connection point and the third connection point is half an electrical energy level at a position on the second resonant wiring overlapping the first connection point.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

A miniaturized single-ended to differential converter is achievable by implementing the electromagnetic resonance coupler according to one or more exemplary embodiments or features disclosed herein.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Underlying Knowledge Forming Basis of the Present Disclosure)

A rat race circuit such as the one disclosed in PTL 1 recited in the Background section is capable of converting one high frequency signal (single-ended signal) into two equal amplitude, anti-phase differential signals.

Figure 1:
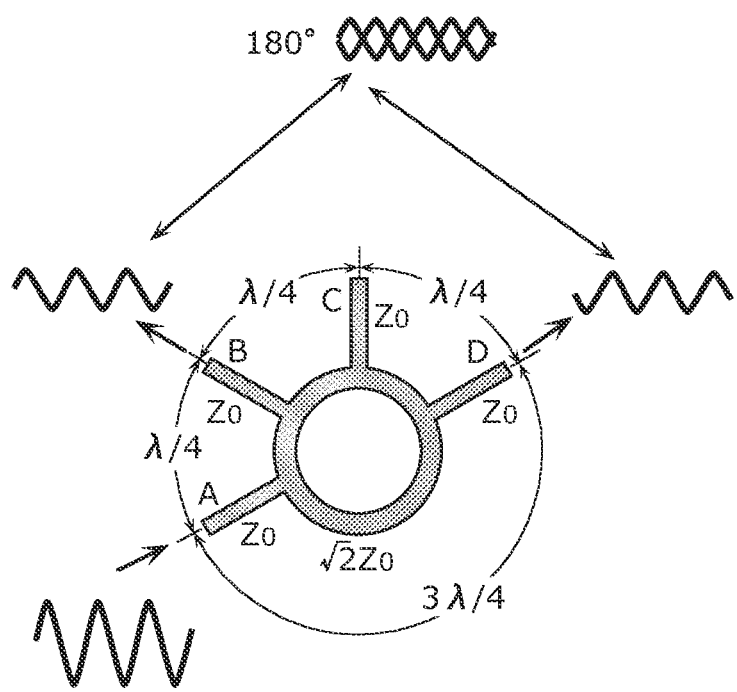
FIG. 1 is a top view of a rat race circuit.

FIG. 1 shows the structure of the distributed constant rat race circuit disclosed in PTL 1.

The impedance at each terminal is R0 (generally 50Ω), and each terminal is connected by a line having an impedance of $\sqrt{2} \times R0$.

In FIG. 1, A is an input terminal, B and D are output terminals, and C is an isolation terminal. The distance (length) between terminals A and B, between terminals B and C, and between terminals C and D is ¼-wavelength of the operating frequency, and the distance between terminals A and D is ¾-wavelength. As a result, equal amplitude, anti-phase signals are outputted from terminals B and D, and no signal is outputted from terminal C.

When a high frequency signal is inputted from terminal A, a signal which has traveled $\lambda/4$ of the ring in a clockwise direction from terminal A and a signal which has traveled $5\lambda/4$ of the ring in a counter-clockwise direction from terminal A arrive at terminal B. In other words, since they are in-phase, the two signals are summed together and outputted to terminal B.

Moreover, similarly, a signal which has traveled $3\lambda/4$ of the ring in a clockwise direction from terminal A and a signal which has traveled $3\lambda/4$ of the ring in a counter-clockwise direction from terminal A arrive at terminal D, and since these two terminals are in-phase, they are summed together and outputted.

In other words, an input signal from terminal A is split and outputted to terminals B and D, and the phase of the signal outputted from terminal B and the phase of the signal outputted from terminal D are in anti-phase (180° out of phase).

In this way, a single-ended signal can be converted into differential signals with a rat race circuit. Moreover, conversely, by inputting equal amplitude, anti-phase signals to terminal B and D, a signal having an amplitude two times that of the signals inputted in terminals B and D is outputted from terminal A.

Miniaturization is problematic with single-ended to differential converters which split a single-ended signal into two equal amplitude, anti-phase differential signals, such as the rat race circuit described above.

In order to overcome the aforementioned problem, an electromagnetic resonance coupler according to an aspect of an exemplary embodiment for transmitting a high frequency signal between first resonant wiring and second resonant wiring wirelessly, the electromagnetic resonance coupler including: a first substrate; a second substrate facing the first substrate; the first resonant wiring provided on the first substrate and having an open loop shape having an opening; first input/output wiring provided on the first substrate and connected to a first connection point on the first resonant wiring; the second resonant wiring provided on the second substrate and having a same wiring width and shape as a wiring width and shape of the first resonant wiring; second input/output wiring provided on the second substrate and connected to a second connection point positioned on the second resonant wiring a predetermined distance away from a first end of the second resonant wiring; and third input/output wiring provided on the second substrate and connected to a third connection point positioned on the second resonant wiring the predetermined distance away from a second end of the second resonant wiring, wherein when viewed in a direction perpendicular to a main surface of the first substrate, the first resonant wiring and the second resonant wiring are symmetric about a point and have matching contours, and when the high frequency signal is inputted to the electromagnetic resonance coupler, an electrical energy level at the second connection point and the third connection point is half an electrical energy level at a position on the second resonant wiring overlapping the first connection point.

With this, a substantially miniaturized single-ended to differential converter using an electromagnetic coupler is achieved. Moreover, with the electromagnetic resonance coupler according to one non-limiting and exemplary embodiment, since it is possible to transmit signals wirelessly, isolation (insulation) of the ground between input/output terminals is possible. Furthermore, since an electromagnetic coupler is used, a low-loss wireless signal transmission apparatus can be achieved.

Moreover, the first connection point may be positioned one quarter of a wiring length of the first resonant wiring away from a first end of the first resonant wiring, the second connection point may be positioned three-eighths of a wiring length of the second resonant wiring away from the first end of the second resonant wiring, and the third connection point may be positioned three-eighths of a wiring length of the second resonant wiring away from the second end of the second resonant wiring.

Moreover, the first resonant wiring and the second resonant wiring may each have a wiring length corresponding to a half wavelength of the high frequency signal in the first resonant wiring and the second resonant wiring.

Moreover, the loop shape may be circular.

Moreover, the loop shape may be rectangular or may be a shape having at least five bends.

With this, it is possible to further reduce the surface area taken up by the resonant wiring on the substrate by making the resonant wiring into loop shape that has at least five bends. In other words, the electromagnetic resonance coupler according to one non-limiting and exemplary embodiment operates as a further miniaturized single-ended to differential converter.

Moreover, the first resonant wiring and the second resonant wiring may be spaced apart in the direction perpendicular to the main surface of the first substrate by a distance of at most a half wavelength of the high frequency signal.

With this, the efficiency of the electromagnetic resonance coupler is improved and a low-loss single-ended to differential converter is achieved.

Moreover, the electromagnetic resonance coupler may further include ground wiring provided either on a surface of the first substrate not provided with the first resonant wiring, or on a surface of the second substrate not provided with the second resonant wiring, the ground wiring indicating a reference potential of the high frequency signal.

Moreover, the electromagnetic resonance coupler may further include ground wiring provided on the first substrate at a periphery of the first resonant wiring and the first input/output wiring, and on the second substrate at a periphery of the second resonant wiring, the second input/output wiring, and the third input/output wiring, the ground wiring indicating a reference potential of the high frequency signal.

Moreover, the second resonant wiring may either be connected to wiring connected to a midpoint of the second connection point and the third connection point, or connected, with a via, to ground wiring indicating a reference potential of the high frequency signal.

In this way, it is possible to improve the quality of the signal transmitted, by adequately providing ground wiring.

Moreover, the electromagnetic resonance coupler may further include; a cover substrate placed over either the first substrate or the second substrate; and ground wiring provided on the cover substrate on a surface thereof not facing a one of the first substrate and the second substrate, the ground wiring indicating a reference potential of the high frequency signal.

In this way, provision of a cover substrate protects against unwanted electromagnetic radiation, resulting in a single-ended to differential converter resistant to external noise.

Moreover, the first substrate and the second substrate may be a single substrate, the first resonant wiring and the first input/output wiring may be provided on a first surface of the substrate, and the second resonant wiring, the second input/output wiring, and the third input/output wiring may be provided on a second surface of the substrate.

With this, it is possible to further miniaturize the single-ended to differential converter.

Hereinafter, certain exemplary embodiments are described in greater detail with reference to the accompanying Drawings.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Hereinafter, the electromagnetic resonance coupler according to Embodiment 1 will be described with reference to the Drawings.
(Structure)

First, the structure of the electromagnetic resonance coupler 100 according to Embodiment 1 will be described.

Figure 2:
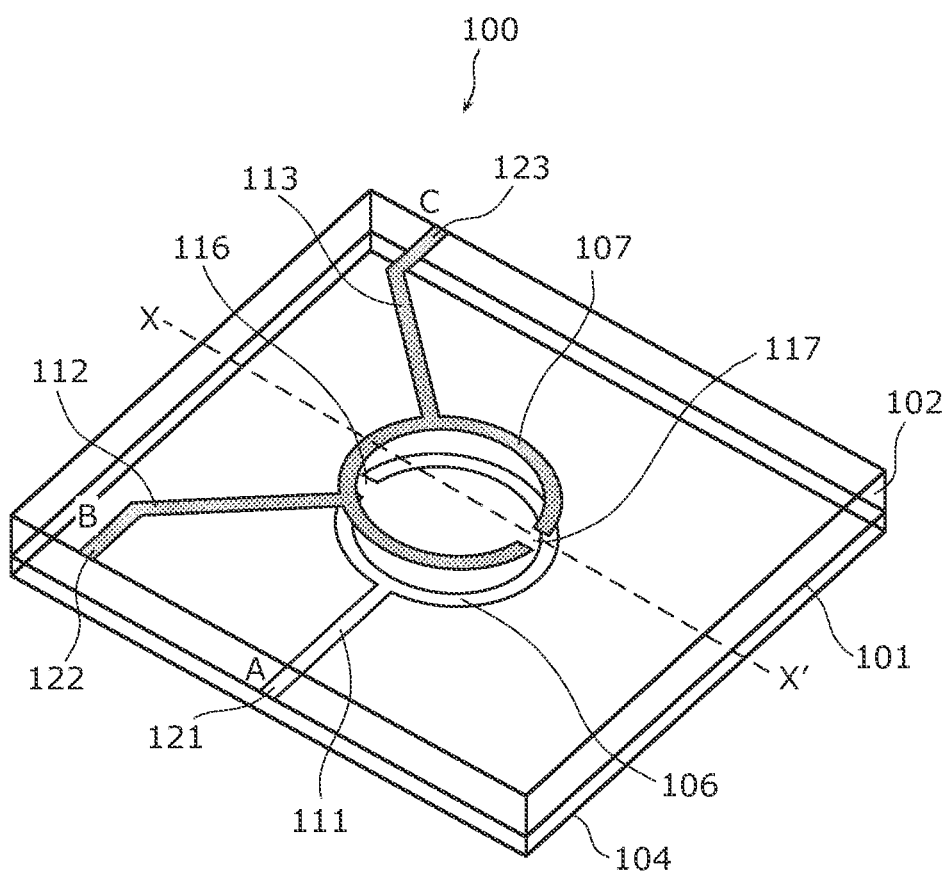
FIG. 2 is a perspective view (transparent view) of the electromagnetic resonance coupler according to Embodiment 1.

FIG. 2 is a perspective view (transparent view) of the electromagnetic resonance coupler 100 according to Embodiment 1.

Figure 3:
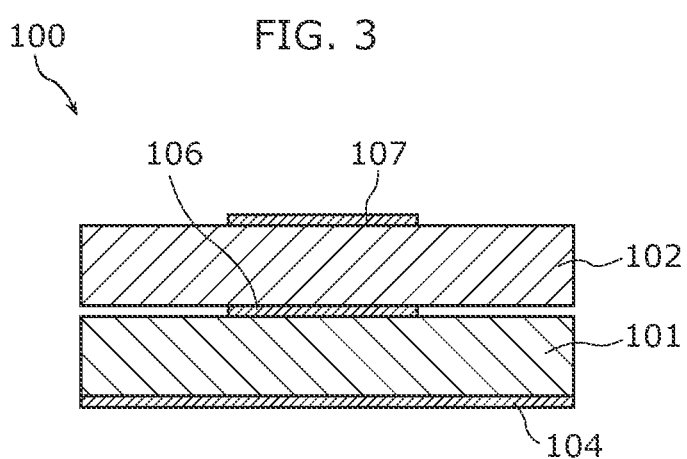
FIG. 3 is a cross section of the electromagnetic resonance coupler in a plane perpendicular to the main surface of the substrate and passing through the line X-X' shown in FIG. 2.

FIG. 3 is a cross section of the electromagnetic resonance coupler 100 shown in FIG. 2 in a plane passing though a diagonal line of the substrate (a plane perpendicular to the main surface of the substrate and passing through the line X-X' shown in FIG. 2).

The electromagnetic resonance coupler 100 according to Embodiment 1 is an electromagnetic resonance coupler that transmits 6.0 GHz AC signals wirelessly. In other words, the operating frequency of the electromagnetic resonance coupler 100 is 6.0 GHz.

The electromagnetic resonance coupler 100 includes a transmission substrate 101 (the first substrate) and a reception substrate 102 (the second substrate) placed over the transmission substrate 101.

The transmission substrate 101 and the reception substrate 102 are dielectric substrates, such as sapphire substrates. Moreover, the thickness of each of the substrates is 0.2 mm. It should be noted that gas (such as air), liquid, or other dielectric material may be present between the substrates.

First wiring 111 made of metal (the first input/output wiring) and a transmitting resonator 106 (the first resonant wiring) made of metal and having a circular shape (an open ring shape) opened by a transmitting resonator slit 116 (the opening) are formed on the top surface of the transmission substrate 101. A first end of the first wiring 111 is connected to the transmitting resonator 106, and the second end of the first wiring 111 is a first terminal 121.

The reception substrate 102 is placed over the transmission substrate 101 to cover the transmitting resonator 106 of the transmission substrate 101.

Second wiring 112 made of metal (the second input/output wiring), third wiring 113 made of metal (the third input/output wiring), and a receiving resonator 107 (the second resonant wiring) made of metal and having a circular shape (an open ring shape) with a portion thereof opened by a receiving resonator slit 117 are formed on the top surface of the reception substrate 102. The receiving resonator 107 is connected to a first end of the second wiring 112 and a first end of the third wiring 113. The second end of the second wiring 112 is a second terminal 122, and the second end of the third wiring 113 is a third terminal 123. Moreover, the receiving resonator 107 is equal in size and shape to the transmitting resonator 106.

The material used for the above-described metal wiring is, for example, gold, but may be a different metal.

Moreover, a bottom surface ground 104, which is made of metal, is formed on the bottom surface of the transmission substrate 101. The bottom surface ground 104 is ground wiring which indicates a reference potential of a signal in the electromagnetic resonance coupler 100. The material used for the bottom surface ground 104 is, for example, gold.

The transmission substrate 101 and the reception substrate 102 overlap in a manner such that the contours of the transmitting resonator 106 and the receiving resonator 107 match when viewed in a direction perpendicular to the main surface of the transmission substrate 101 (when viewed from above). Additionally, the transmission substrate 101 and the reception substrate 102 overlap in a manner such that the transmitting resonator 106 and the receiving resonator 107 are symmetrical about a point when viewed from above.

It should be noted that "matching" in reference to the contours of the transmitting resonator 106 and the receiving resonator 107 also includes instances where the contours of the transmitting resonator 106 and the receiving resonator 107 are different, but are within a manufacturing margin of error.

Here, the contour of the transmitting resonator 106 is defined as follows. Assuming that the transmitting resonator slit 116 is not provided in the transmitting resonator 106 and the transmitting resonator 106 is wiring having a closed-loop-shape, this closed-loop-shaped wiring includes an inner circumference contour (inner contour) and an outer circumference contour (outer contour). Here, the inner circumference contour defines an area surrounded by the closed-loop-shaped wiring, and the outer circumference contour defines the shape of the closed-loop-shaped wiring including the inner circumference contour. Of these two contours, the contour of the transmitting resonator 106 refers to the outer circumference contour. In other words, the wiring width of the transmitting resonator 106 is defined by the inner circumference contour and outer circumference contour, and the area occupied by the transmitting resonator 106 is defined by the outer circumference contour. It should be noted that the contour of the receiving resonator 107 is also defined in the same manner.

In other words, in Embodiment 1, the contour of the transmitting resonator 106 is the outermost shape of the transmitting resonator 106 and is circular, and the contour of the receiving resonator 107 is the outermost shape of the receiving resonator 107 and is circular. In this case, the contours "matching" means the contours of the transmitting resonator 106 and the receiving resonator 107, excluding the portions corresponding to the transmitting resonator slit 116 and the receiving resonator slit 117, match.

It should be noted that "matching" means matching in a practical sense, and allows for the inclusion of inconsistencies in the assembly of the transmission substrate 101 and the reception substrate 102 of the electromagnetic resonance coupler 100, and inconsistencies in the size of the transmitting resonator 106 and the receiving resonator 107 occurring in the manufacturing thereof. In other words, "matching" contours does not necessarily mean an exact match.

Next, each substrate will be described in detail using FIG. 4 and FIG. 5.

Figure 4:
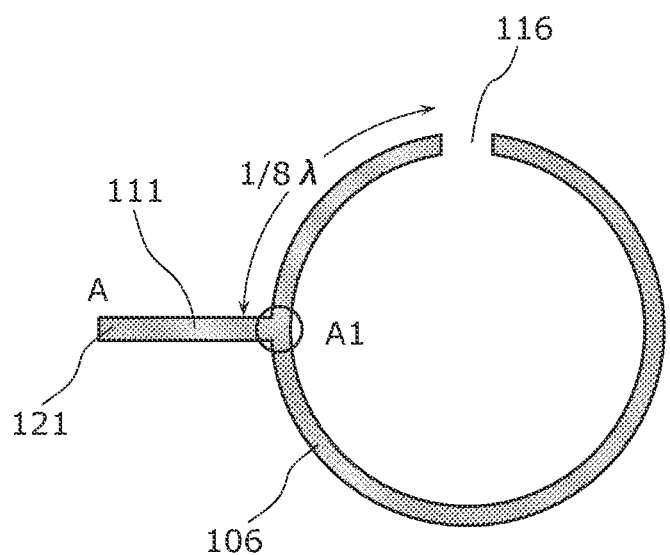
FIG. 4 is a top view of the transmitting resonator.

FIG. 4 is a top view of the transmitting resonator 106.

The transmitting resonator 106 has a circular shape with a diameter of 2.7 mm. Furthermore, the shape of the transmitting resonator 106 is a loop shape (closed curve) with a portion opened by the transmitting resonator slit 116. The wiring length of the transmitting resonator 106 is equal to one half of a wavelength of the 6.0 GHz AC signal. The wiring width of the transmitting resonator 106 is 0.1 mm.

The wiring length (length of the loop) of the transmitting resonator 106 is equal to approximately one half of a wavelength of the high frequency signals transmitted by the electromagnetic resonance coupler 100. This wavelength is obtained taking the wavelength compaction ratio respective to the wiring material into account.

The transmitting resonator 106 and the first wiring 111 are physically connected together. It should be noted that the transmitting resonator 106 and the first wiring 111 are not required to be physically connected together, and may be electrically connected. More specifically, the first end of the first wiring 111 is connected to the transmitting resonator 106 at a position (point A1: the first connection point) one-fourth of the wiring length of the transmitting resonator 106 away from a first end of the transmitting resonator 106 created by the transmitting resonator slit 116. In other words, one-fourth of the wiring length is equal to approximately one-eighth of the wavelength of the high frequency signals transmitted by the electromagnetic resonance coupler 100.

The second end of the first wiring 111 not connected to the transmitting resonator 106 is the first terminal 121. The wiring width of the first wiring 111 is 0.1 mm. The reception substrate 102 is placed over the top surface of transmission substrate 101.

Figure 5:
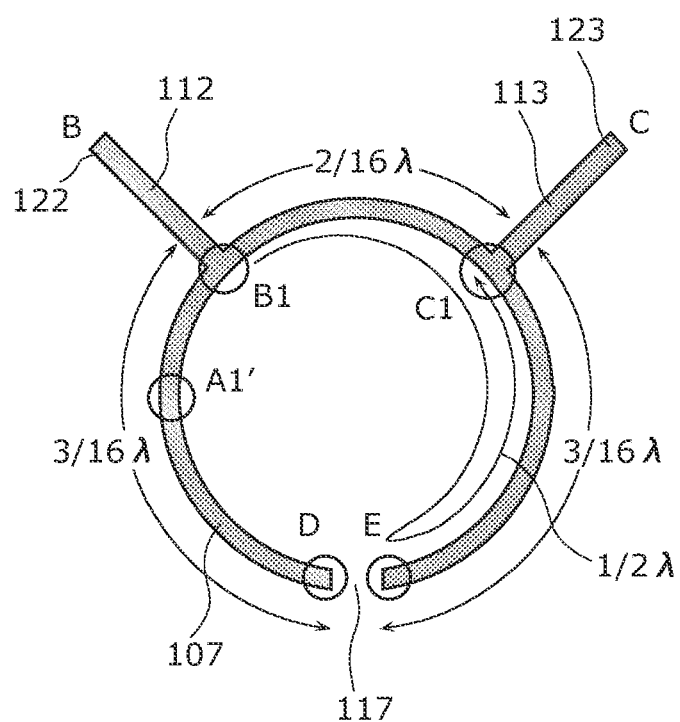
FIG. 5 is a top view of the receiving resonator.

FIG. 5 is a top view of the receiving resonator 107.

The receiving resonator 107 has a circular shape with a diameter of 2.7 mm. Furthermore, the shape of the receiving resonator 107 is a loop shape (closed curve) with a portion opened by the receiving resonator slit 117. The wiring width of the receiving resonator 107 is 0.1 mm. In other words, the receiving resonator 107 is equal in size and shape to the transmitting resonator 106.

The receiving resonator 107 is physically connected to the second wiring 112 and the third wiring 113. It should be noted that the receiving resonator 107 is not required to be physically connected to the second wiring 112 and the third wiring 113, but may be electrically connected thereto.

The locations of the connection point of the receiving resonator 107 and the second wiring 112 and the connection point of the receiving resonator 107 and the third wiring 113 are symmetrical with respect to the receiving resonator slit 117. More specifically, the first end of the second wiring 112 is connected to the receiving resonator 107 at a position (point B1: the second connection point) three-eighths of the wiring length of the receiving resonator 107 away from a first end (point D) of the receiving resonator 107 created by the receiving resonator slit 117. In other words, three-eighths of the wiring length is equal to approximately three-sixteenths of the wavelength of the high frequency signals transmitted by the electromagnetic resonance coupler 100.

Moreover, the third wiring 113 is connected to the receiving resonator 107 at a position (point C1: the third connection point) five-eighths of the wiring length of the receiving resonator 107 away from the first end (point D) of the receiving resonator 107 created by the receiving resonator slit 117. In other words, five-eighths of the wiring length is equal to approximately five-sixteenths of the wavelength of the high frequency signals transmitted by the electromagnetic resonance coupler 100.

In other words, the third wiring 113 is connected to the receiving resonator 107 at a position (point C1) three-eighths of the wiring length of the receiving resonator 107 away from the second end (point E) of the receiving resonator 107 created by the receiving resonator slit 117.

It should be noted that point A1' on the receiving resonator 107 corresponds to point A1 on the transmitting resonator 106 overlapping with the receiving resonator 107.

The second end of the second wiring 112 that is not connected to the receiving resonator 107 is the second terminal 122, and the second end of the third wiring 113 that is not connected to the receiving resonator 107 is the third terminal 123. The wiring width of the second wiring 112 and the third wiring 113 is 0.1 mm.

It should be noted that the position of point A1 at which the first wiring 111 and the transmitting resonator 106 are connected together is, in actuality, slightly adjusted taking input impedance and manufacturing inconsistencies into consideration. For this reason, the position of point A1 is not required to exactly match the position shown in FIG. 4.

Similarly, the position of point B1 at which the second wiring 112 and the receiving resonator 107 are connected together and the position of C1 at which the third wiring 113 and the receiving resonator 107 are connected together are, in actuality, slightly adjusted taking input impedance and manufacturing inconsistencies into consideration. For this reason, the positions of point B1 and point C1 are not required to exactly match the positions shown in FIG. 5.

Moreover, in consideration of the above impedance, the wiring width of the second wiring 112 and the third wiring 113 may be made larger than the wiring width of the first wiring 111. For example, the wiring width of the second wiring 112 and the third wiring 113 may be 0.2 mm with respect to the wiring width of the first wiring 111 being 0.1 mm. However, it should be noted that the wiring width of the second wiring 112 and the third wiring 113 is not limited to this example.

Moreover, the distance between the transmitting resonator 106 and the receiving resonator 107 is 0.2 mm, which is the thickness of the reception substrate 102. This is no more than one half of the wavelength (operating wavelength) of the 6.0 GHz AC signal input to the electromagnetic resonance coupler 100 in Embodiment 1. This wavelength is obtained taking the wavelength compaction ratio dependent on the media (sapphire) between the transmitting resonator 106 and the receiving resonator 107 into account. In other words, under this condition, the transmitting resonator 106 and the receiving resonator 107 are coupled by electromagnetic resonant coupling in a near field.

It should be noted that the distance between the transmitting resonator 106 and the receiving resonator 107 is not limited to one half of the operating wavelength or less. Operation is possible at distances higher than this. However, operation efficiency is optimal when the distance between the transmitting resonator 106 and the receiving resonator 107 is no more than one half of the operating wavelength.

(Operation)

Next, the operation of the electromagnetic resonance coupler 100 according to Embodiment 1 will be described.

The high frequency signal inputted from the first terminal 121 is inputted to the transmitting resonator 106 via the first wiring 111. As described above, the transmitting resonator 106 and the receiving resonator 107 overlap each other and are spaced apart at a distance equal to no more than one half of the inputted high frequency signal (operating frequency 6.0 GHz), and are coupled by electromagnetic resonant coupling.

Since the total length of the wiring of transmitting resonator 106 is set to one half of the operating wavelength, the high frequency signal inputted to the transmitting resonator 106 enters a resonating state in the transmitting resonator 106, exciting the electromagnetic field in the vicinity. When the electromagnetic field in the transmitting resonator 106 is excited, the electromagnetic field in the receiving resonator 107, which is coupled to the transmitting resonator 106 by electromagnetic resonant coupling, is also excited. In other words, the 6.0 GHz high frequency signal is in a resonating state in the receiving resonator 107 as well. This causes an AC signal to be transmitted to the receiving resonator 107 wirelessly.

It should be noted that the total length of the wiring of each the transmitting resonator 106 and the receiving resonator 107 may be set to an integral multiple of one half of the operating wavelength. In other words, the total length of the wiring of each the transmitting resonator 106 and the receiving resonator 107 may be set to $(\lambda/2) \times n$, where $\lambda$ is the operating wavelength and n is an integer. That is to say, the total length of the wiring of each the transmitting resonator 106 and the receiving resonator 107 is not limited to one half of the operating wavelength.

As FIG. 5 shows, in the receiving resonator 107, the AC signal transmitted from the transmitting resonator 106 is reflected at the first end (point D) of the receiving resonator 107 and the second end (point E) of the receiving resonator 107, and enters a resonating state.

At this time, it is believed that the high frequency signal at point C1 arrives there from point B1 after being reflected back from point E. The length of the path from point B1 to point E and back to point C1 is equal to one half of the wavelength of the transmitted high frequency signal. As such, the waveform of the high frequency signal at point C1 has a phase difference of one half the wavelength of the high frequency signal at point B1 (180° difference). In other words, signals 180° out of phase are available from points B1 and C1.

Next, the location of the connection point of the first wiring 111 and the transmitting resonator 106 (point A1) and the locations of the connection points of the second wiring 112 and third wiring 113 to the receiving resonator 107 (point B1 and point C1) will be discussed.

Figure 6:
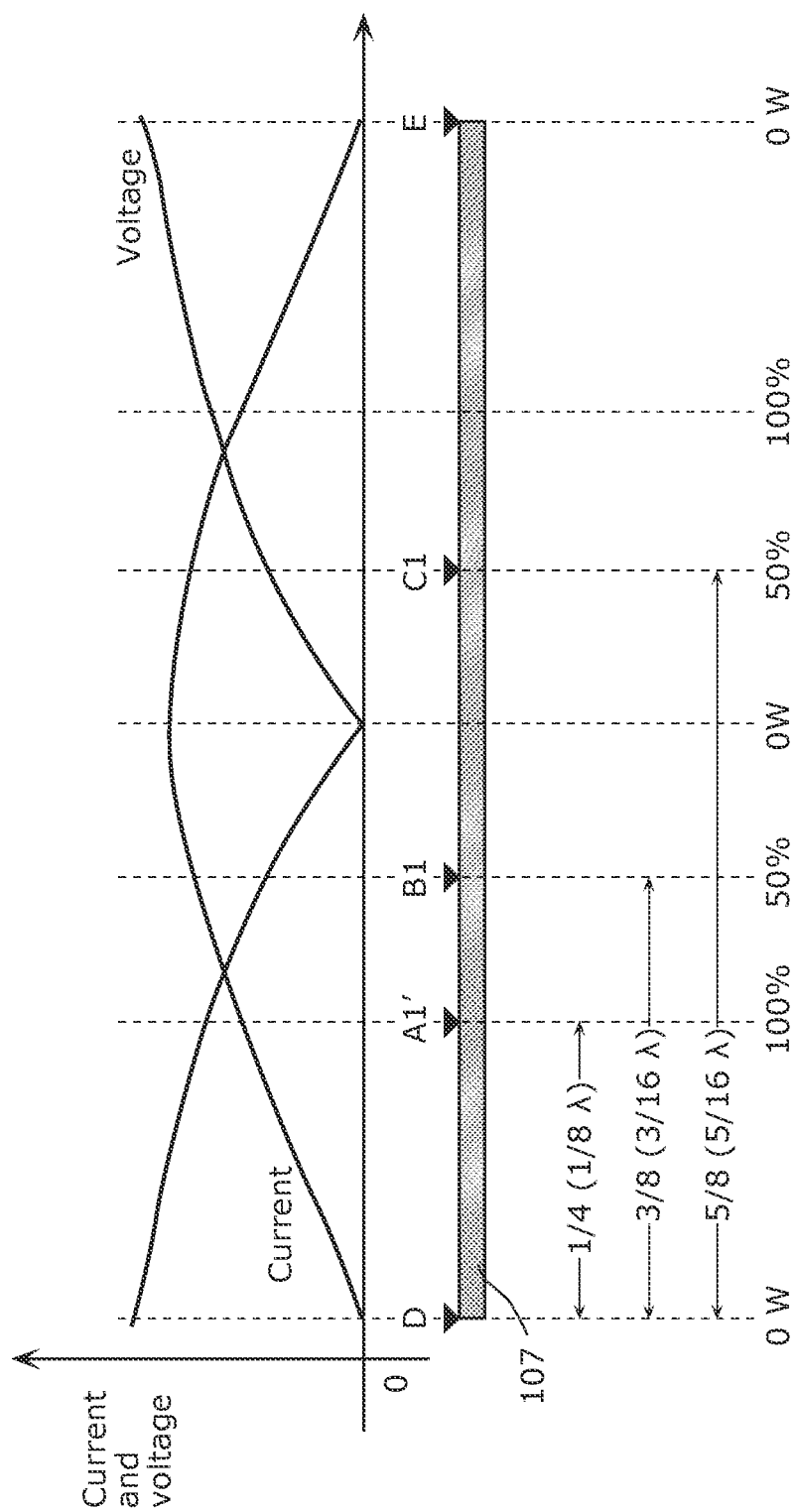
FIG. 6 shows the relationship between voltage and current in the receiving resonator in a resonating state.

FIG. 6 shows the relationship between voltage and current in the receiving resonator 107 in a resonating state.

FIG. 6 schematically shows how voltage and current are distributed when the circular wiring of the receiving resonator 107 is made into a straight line and a 6.0 GHz high frequency signal is inputted to the receiving resonator 107 in a resonating state.

Point A1', point B1, point C1, point D, and point E shown in FIG. 6 correspond to the same points shown in FIG. 5. When electrical energy is inputted at point A1 on the transmitting resonator 106, the same amount of electrical energy is also inputted to point A1' on the receiving resonator 107 coupled to the transmitting resonator 106 by electromagnetic resonant coupling.

In the resonating state, the receiving resonator 107 has voltage and current levels like FIG. 6 shows, so when the electrical energy at point A1' is split in two, the points at which the electrical energy level becomes half are point B1 and point C1. Point B1 and point C1 are positioned symmetrically with respect to the receiving resonator slit 117, as previously described, and the signals manifesting at point B1 and point C1 are 180° out of phase.

With this, the electromagnetic resonance coupler 100 operates as a single-ended to differential converter.

Figure 7:
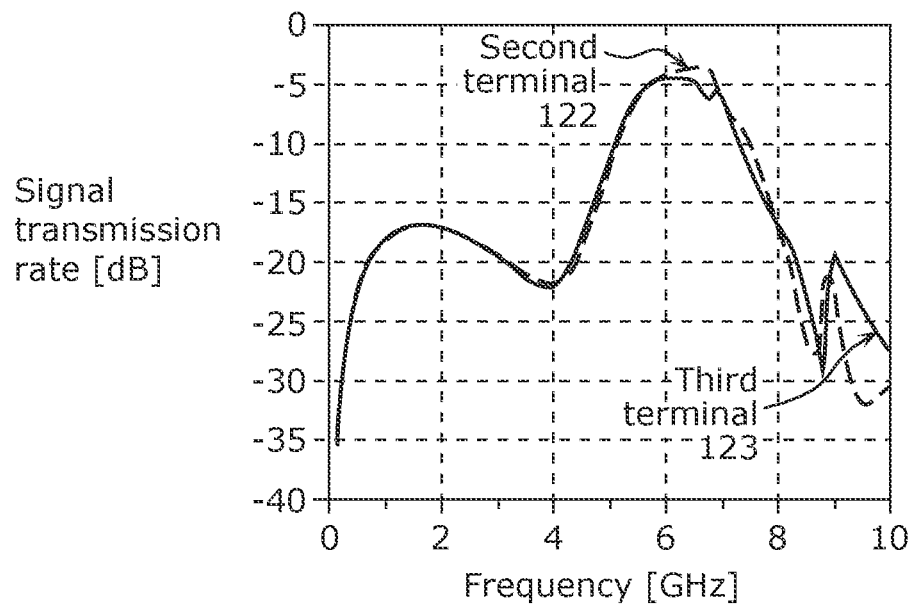
FIG. 7 shows the signal transmission rate of the electromagnetic resonance coupler when a signal is inputted to the first terminal.
Figure 8:
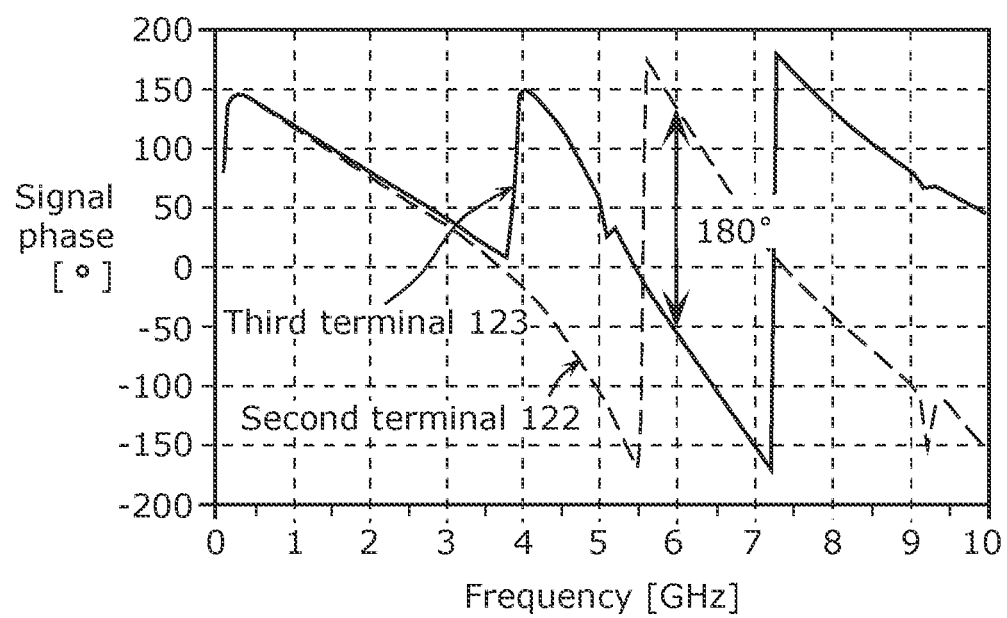
FIG. 8 shows the phases of signals outputted from the second terminal and the third terminal when a signal is inputted to the first terminal.

Next, the operation of the above-described electromagnetic resonance coupler 100 will be described with reference to data (FIG. 7 and FIG. 8).

FIG. 7 shows the signal transmission rate of the electromagnetic resonance coupler 100 when a signal is inputted to the first terminal 121.

Signal transmission rate is represented on the vertical axis of the graph in FIG. 7. Signal transmission rate is the ratio of electrical energy of signals outputted from the second terminal 122 and the third terminal 123 to electrical energy of a signal inputted to the first terminal 121 shown in decibels. The frequency of the signal inputted to the first terminal 121 is represented on the horizontal axis of the graph in FIG. 7.

As FIG. 7 shows, when a 6.0 GHz high frequency signal is inputted to the first terminal 121, signals having approximately half (−3 dB) the electrical energy of the signal inputted to the first terminal 121 are outputted from the second terminal 122 and the third terminal 123.

In this way, with Embodiment 1, it is known that the electrical energy inputted to the first terminal 121 can be split between the second terminal 122 and the third terminal 123.

Moreover, the difference in electrical energy outputted by the second terminal 122 and the third terminal 123 is low, and the power inputted to the first terminal 121 is split uniformly between the second terminal 122 and the third terminal 123.

FIG. 8 shows the phases of signals outputted from the second terminal 122 and the third terminal 123 when a signal is inputted to the first terminal 121.

The phases of the signals outputted from the second terminal 122 and the third terminal 123 are represented on the vertical axis of the graph in FIG. 8. The frequency of the AC signal inputted to the first terminal 121 is represented on the horizontal axis of the graph in FIG. 8.

As FIG. 8 shows, in the frequency band of 6.0 GHz, the phase of the signal outputted by the second terminal 122 and the phase of the signal outputted by the third terminal 123 are different by 180°.

With the data shown in FIG. 7 and FIG. 8, it is known that it is possible to convert a single-ended signal into two equal amplitude, anti-phase differential signals in the electromagnetic resonance coupler 100.

The wiring length (circumference length) of a rat race circuit like the one shown in FIG. 1 is two-thirds of the wavelength (operating wavelength) of inputted high frequency signals, but with the electromagnetic resonance coupler 100 according to Embodiment 1, the wiring length of the transmitting resonator 106 and the receiving resonator 107 may be one half of the operating wavelength. As such, when comparing surface areas, the surface area of the transmitting resonator 106 and the receiving resonator 107 is one-ninth that of the rat race circuit shown in FIG. 1.

In this way, a miniaturized single-ended to differential converter is achievable by implementing the electromagnetic resonance coupler according to one or more exemplary embodiments or features disclosed herein.

It should be noted that the positions of the first connection point (point A1) at which the first wiring 111 is connected to the transmitting resonator 106, the second connection point (point B1) at which the second wiring 112 is connected to the receiving resonator 107, and the third connection point (point C1) at which the third wiring 113 is connected to the receiving resonator 107 are not limited to the above examples.

It should be noted that in the electromagnetic resonance coupler 100 according to Embodiment 1, wiring which indicates a reference potential of the transmitting resonator 106 and wiring which indicates a reference potential of the receiving resonator 107 are both the bottom surface ground 104. Since the transmitting resonator 106 and the receiving resonator 107 are not physically connected, the reference potential of the signals in the transmission substrate 101 and the reception substrate 102 need not be exactly the same. The transmission substrate 101 and the reception substrate 102 may be provided with wiring which indicate different reference potentials.

In other words, it is possible to insulate the ground and transmit signals between the transmission substrate 101 and the reception substrate 102. More specifically, for example, it is possible to input to the first terminal 121 a signal with a reference of 0 V, and output signals from the second terminal 122 and the third terminal 123 with a reference of 100 V.

Moreover, in Embodiment 1, an example of converting a single-ended signal into differential signals is described, but of course it is also possible to convert differential signals into a single-ended signal. More specifically, by inputting equal amplitude, anti-phase high frequency signals to the second terminal 122 and the third terminal 123, a single-ended high frequency signal is outputted from the first terminal.

Moreover, with the electromagnetic resonance coupler 100, it is possible to transmit signals with substantially low loss by electromagnetic resonant coupling. In other words, according to one or more exemplary embodiments or features disclosed herein, it is possible to realize a low-loss power coupler and distributor.

Embodiment 2

Next, the electromagnetic resonance coupler according to Embodiment 2 will be described with reference to the Drawings. Embodiment 1 describes an open ring shaped electromagnetic resonance coupler 100 where the transmitting resonator and the receiving resonator are circular in shape, but the transmitting resonator receiving resonator may be rectangular in shape. Embodiment 2 describes an electromagnetic resonance coupler having a rectangular shaped transmitting resonator and receiving resonator.

It should be noted that the main difference between the electromagnetic resonance coupler described in the following Embodiment 2 and the electromagnetic resonance coupler 100 described in Embodiment 1 is the shape of the transmitting resonator and receiving resonator. Other structural elements, particularly those not described, perform the same function and operate the same as in Embodiment 1.

(Structure)

Figure 9:
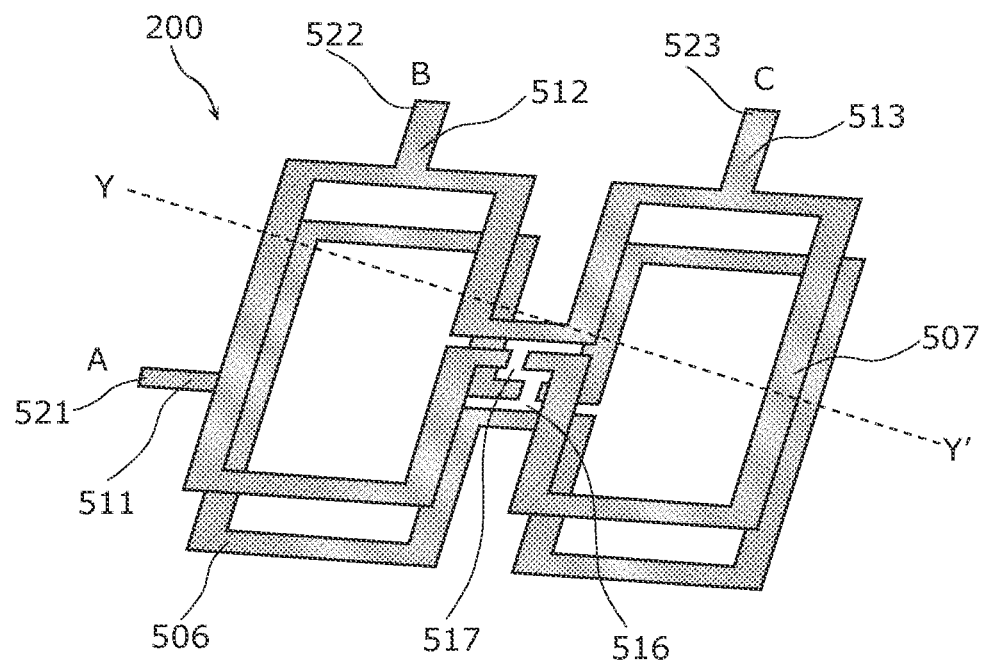
FIG. 9 is a perspective view of the electromagnetic resonance coupler having a rectangular transmitting resonator and receiving resonator.

FIG. 9 is a perspective view of the electromagnetic resonance coupler 200 having a rectangular transmitting resonator and receiving resonator. FIG. 9 schematically only shows, in particular, the transmitting resonator 506 (first resonant wiring) and the receiving resonator 507 (second resonant wiring) formed on substrates.

Figure 10:
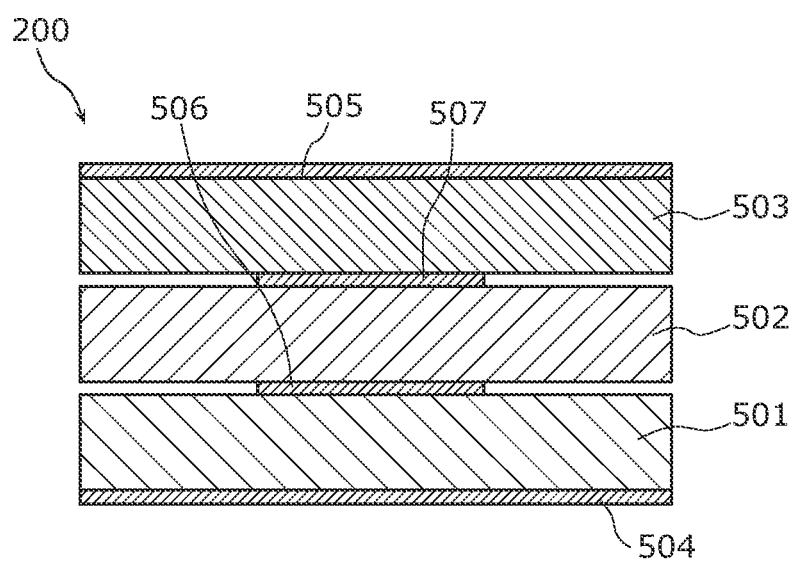
FIG. 10 is a cross section of the electromagnetic resonance coupler in a plane perpendicular to the main surface of the substrate and passing through the line Y-Y' shown in FIG. 9.

FIG. 10 is a cross section of the electromagnetic resonance coupler 200 in a plane perpendicular to the main surface of the substrate and passing through the line Y-Y' shown in FIG. 9.

The electromagnetic resonance coupler 200 according to Embodiment 2 includes a transmission substrate 501 (the first substrate), a reception substrate 502 (the second substrate) which is placed over the transmission substrate 501, and a cover substrate 503 which is placed over the reception substrate 502.

The transmission substrate 501, the reception substrate 502, and the cover substrate 503 are dielectric substrates, such as sapphire substrates. However, the material used for the substrates is not limited to sapphire. For example, the substrate material may be silicon. Moreover, the transmission substrate 501, the reception substrate 502, and the cover substrate 503 may each be made of different material.

The thickness of each the transmission substrate 501, the reception substrate 502, and the cover substrate 503 is, but not limited to, 0.2 mm. Moreover, the transmission substrate 501, the reception substrate 502, and the cover substrate 503 may each have a different thickness.

A bottom surface ground 504, which is made of metal, is formed on the bottom surface of the transmission substrate 501. The bottom surface ground 504 is ground wiring which indicates a reference potential of a signal in the electromagnetic resonance coupler 200. The material used for the bottom surface ground 504 is, for example, gold.

First wiring 511 made of metal (the first input/output wiring) and a transmitting resonator 106 (the first resonant wiring) made of metal and having a rectangular shape (an open loop shape) with a portion thereof opened by a transmitting resonator slit 516 (the opening) are formed on the top surface of the transmission substrate 501 (or the bottom surface of the reception substrate 502). A first end of the first wiring 511 is connected to the transmitting resonator 506, and the second end of the first wiring 511 is a first terminal 521.

The reception substrate 502 is placed over the transmission substrate 501 to cover the transmitting resonator 506 of the transmission substrate 501. The transmission substrate 501 and the reception substrate 502 overlap in a manner such that the contours of the transmitting resonator 506 and the receiving resonator 507 match when viewed from above. Additionally, the transmission substrate 501 and the reception substrate 502 overlap in a manner such that the transmitting resonator 506 and the receiving resonator 507 are symmetrical about a point when viewed from above.

Here, the shape of contours of the transmitting resonator 506 and the receiving resonator 507 is represented by the dotted and dashed line in FIG. 12, to be described later. In this case, the contours "matching" means the contours of the transmitting resonator 506 and the receiving resonator 507 excluding the portions corresponding to the transmitting resonator slit 516 and the receiving resonator slit 517 match.

Second wiring 512 made of metal (the second input/output wiring), third wiring 513 made of metal (the third input/output wiring), and a receiving resonator 507 (the second resonant wiring) made of metal and having a rectangular shape (an open loop shape) with a portion thereof opened by a receiving resonator slit 517 are formed on the top surface of the reception substrate 502 (or on the bottom surface of the cover substrate 503). The receiving resonator 507 is connected to a first end of the second wiring 512 and a first end of the third wiring 513. The second end of the second wiring 512 is a second terminal 522, and the second end of the third wiring 513 is a third terminal 523.

The material used for the above-described metal wiring is, for example, gold, but may be a different metal.

The cover substrate 503 is placed over the reception substrate 502 for the purpose of protection of influence from unwanted electromagnetic waves.

A cover ground 505, which is made of metal, is formed on the top surface of the cover substrate 503. The cover ground 505 is ground wiring which indicates a reference potential of a signal in the electromagnetic resonance coupler 200. The material used for the cover ground 505 is, for example, gold.

It should be noted that the cover substrate and the cover ground may of course also be provided in the electromagnetic resonance coupler 100 according to Embodiment 1.

Next, the transmitting resonator 506 and the receiving resonator 507 will be discussed in detail.

First, the transmitting resonator 506 will be discussed.

Figure 11:
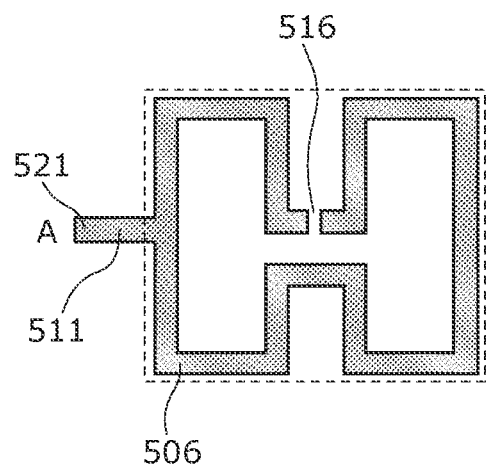
FIG. 11 is a top view of a rectangular transmitting resonator.

FIG. 11 is a top view of the transmitting resonator 506.

The transmitting resonator 506 provided on the transmission substrate 501 is wiring having an open loop shape with a portion opened by the transmitting resonator slit 516. The transmitting resonator 506 has a shape having at least five bends. More specifically, the transmitting resonator 506 has a shape having twelve bends. Here, a bend may be a 90 degree bend like those shown in FIG. 11, or may be a rounded bend.

In this way, by having bends, the electromagnetic resonance coupler 200 can be miniaturized to a size smaller than the electromagnetic resonance coupler 100 can be.

The transmitting resonator 506 is wiring having, excluding the portion indented inward, a rectangular external shape (the dashed line in FIG. 11), and the transmitting resonator slit 516 is provided inward relative to the external shape of the transmitting resonator 506 (the dashed line in FIG. 11).

Moreover, the loop shape of the transmitting resonator 506, excluding the transmitting resonator slit 516 portion, is symmetrical about the center. The wiring length of the transmitting resonator 506 is equal to one half of a wavelength of the 6.0 GHz AC signal. This wavelength is obtained taking the wavelength compaction ratio respective to the wiring material into account.

It should be noted that the transmitting resonator 506 (receiving resonator 507) is not limited to the shape shown in FIG. 11. For example, the transmitting resonator 506 (receiving resonator 507) may have a shape similar to that shown by the dashed line in FIG. 11 (a square or rectangle).

The transmitting resonator 506 and the first wiring 511 are physically connected together. It should be noted that the transmitting resonator 506 and the first wiring 511 are not required to be physically connected together, and may be electrically connected.

More specifically, the first end of the first wiring 511 is connected to the transmitting resonator 506 a position one-fourth of the wiring length of the transmitting resonator 506 away from a first end of the transmitting resonator 506 created by the transmitting resonator slit 516. In other words, one-fourth of the wiring length is equal to approximately one-eighth of the wavelength of the high frequency signals transmitted by the electromagnetic resonance coupler 200.

The second end of the first wiring 511 (the end not connected to the transmitting resonator 506) is the first terminal 521.

The reception substrate 502 is placed over the top surface of transmission substrate 501.

Next, the receiving resonator 507 will be discussed.

Figure 12:
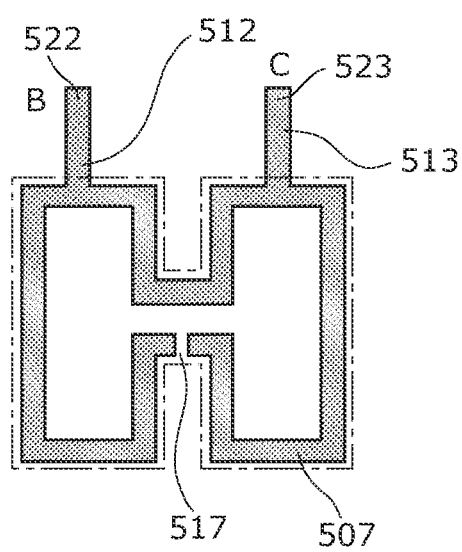
FIG. 12 is a top view of a rectangular receiving resonator.

FIG. 12 is a top view of the receiving resonator 507.

The receiving resonator 507 provided on the reception substrate 502 is wiring having an open loop shape with a portion opened by the receiving resonator slit 517.

Moreover, the receiving resonator 507 is equal in size and shape to the transmitting resonator 506.

The receiving resonator 507 is physically connected to the second wiring 512 and the third wiring 513. It should be noted that the receiving resonator 507 is not required to be physically connected to the second wiring 512 and the third wiring 513, but may be electrically connected thereto.

The locations of the connection point of the receiving resonator 507 and the second wiring 512 and the connection point of the receiving resonator 507 and the third wiring 513 are symmetrical with respect to the receiving resonator slit 517. More specifically, the first end of the second wiring 512 is connected to the receiving resonator 507 at a position three-eighths of the wiring length of the receiving resonator 507 (three-sixteenths of the operating wavelength) away from a first end of the receiving resonator 507 (created by the receiving resonator slit 517).

Moreover, the first end of the third wiring 513 is connected to the receiving resonator 507 at a position three-eighths of the wiring length of the receiving resonator 507 (three-sixteenths of the operating wavelength) away from the second end of the receiving resonator 507 (created by the receiving resonator slit 517). In other words, the first end of the third wiring 513 is connected to the receiving resonator 507 at a position five-eighths of the wiring length of the receiving resonator 507 (five-sixteenths of the operating wavelength) away from the first end of the receiving resonator 507.

The second end of the second wiring 512 that is not connected to the receiving resonator 507 is the second terminal 522, and the second end of the third wiring 513 that is not connected to the receiving resonator 507 is the third terminal 523.

The transmitting resonator 506 on the transmission substrate 501 and the receiving resonator 507 on the reception substrate 502 are symmetrical about a midpoint of the transmitting resonator 506 and the receiving resonator 507, which is also the center axis of the transmitting resonator 506 and the receiving resonator 507.

It should be noted that, similar to Embodiment 1, the wiring width of the transmitting resonator 506 and the receiving resonator 507 is 0.1 mm. The wiring width of the first wiring 511, the second wiring 512, and the third wiring 513 is 0.1 mm. Moreover, one side of the outer circumference of the transmitting resonator 506 and the receiving resonator 507 wiring is 1.6 mm.

(Operation)

The operating principle and function of the electromagnetic resonance coupler 200 is the same as that of the electromagnetic resonance coupler 100 according to Embodiment 1, and the electromagnetic resonance coupler 200 is capable of performing single-ended to differential conversion on 6.0 GHz high frequency signals.

The high frequency signal (6.0 GHz) inputted from the first terminal 521 is inputted to the transmitting resonator 506 via the first wiring 511 connected to the first connection point, and resonates with the transmitting resonator 506, thereby exciting the electromagnetic field.

When the electromagnetic field in the transmitting resonator 506 is excited, the electromagnetic field in the receiving resonator 507 is also excited. This causes the high frequency signal in the receiving resonator 507 to propagate. Propagated high frequency signals are output from the second terminal 522 and the third terminal 523 via the second wiring 512 and the third wiring 513.

At this time, as was explained in Embodiment 1, signals having a phase difference of 180° are outputted at the second connection point on the receiving resonator 507 at which the second wiring 512 is connected and the third connection point on the receiving resonator 507 at which the third wiring 513 is connected. Moreover, as described in Embodiment 1, the amplitude of the outputted signals is one half the amplitude of the input high frequency signal.

In this way, even with the use of a rectangular resonator, it is possible to realize an electromagnetic resonance coupler which converts single-ended signals into differential signals. The electromagnetic resonance coupler 200 operates as a miniaturized single-ended to differential converter, even more miniaturized than when an open ring shaped resonator is used, as is the case in Embodiment 1.

It should be noted that in the electromagnetic resonance coupler 200 as well, it goes without saying that it is possible to insulate the grounds and transmit signals between the transmission substrate 501 and the reception substrate 502. Moreover, in the electromagnetic resonance coupler 200, it is of course possible to also convert differential signals into a single-ended signal.

(Additional Comments)

Moreover, ground wiring (the coplanar ground), which indicates a reference potential of the transmitted the high frequency signal, may be provided at the periphery of the transmitting resonator and the receiving resonator in the electromagnetic resonance coupler 100 and the electromagnetic resonance coupler 200.

Moreover, in the electromagnetic resonance coupler 100 and the electromagnetic resonance coupler 200, the midpoint of the second connection point on the receiving resonator at which the second wiring is connected and the third connection point on the receiving resonator at which the third wiring is connected may be connected to ground wiring with wiring or a via.

Figure 13:
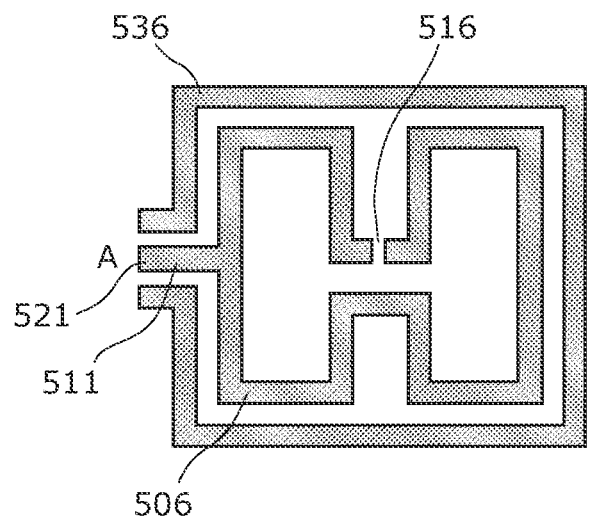
FIG. 13 shows an example of when a coplanar ground is provided at a periphery of the transmitting resonator.

FIG. 13 shows an example of when a coplanar ground is provided at the periphery of the transmitting resonator 506.

Figure 14:
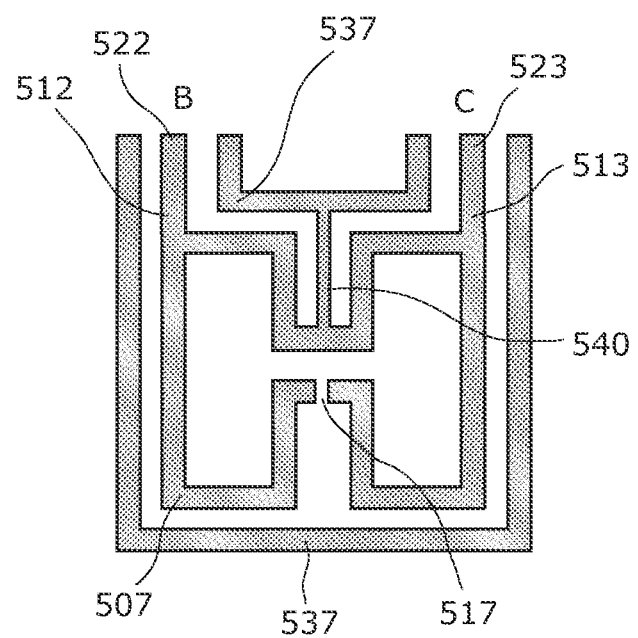
FIG. 14 shows an example of when a coplanar ground and isolation wiring is provided at a periphery of the receiving resonator.

FIG. 14 shows an example of when a coplanar ground and isolation wiring are provided at the periphery of the receiving resonator 507.

As FIG. 13 shows, a transmission coplanar ground 536 made of a metal conductor may be provided along the periphery of the transmitting resonator 506 and the first wiring 511.

Moreover, as FIG. 14 shows, a reception coplanar ground 537 may be provided along the periphery of the receiving resonator 507, the second wiring 512, and the third wiring 513. Material used for the transmission coplanar ground 536 and the reception coplanar ground 537 is, just like the other wiring, gold, but the material used is not limited to gold.

In this way, it is possible to improve the quality of the transmitted high frequency signal by providing a coplanar ground.

Moreover, a configuration in which only one of the transmission coplanar ground 536 and the reception coplanar ground 537 is provided is acceptable.

Moreover, as FIG. 14 shows, isolation wiring 540 may be provided at the midpoint between the second connection point on the receiving resonator 507 at which the second wiring 512 is connected and the third connection point on the receiving resonator 507 at which the third wiring 513 is connected, and may connect to the reception coplanar ground 537 and the receiving resonator 507.

By providing isolation wiring in this way, it is possible to improve the quality of the high frequency signal input and/or output to and/or from the second wiring 512 and the third wiring 513.

Moreover, instead of the isolation wiring 540, ground wiring indicating reference potential may be connected with a via, for example, to the midpoint between the second connection point on the receiving resonator 507 and the third connection point on the receiving resonator 507.

It should be noted that in the electromagnetic resonance coupler 100 and the electromagnetic resonance coupler 200, the transmitting resonator and the receiving resonator may be provided on respective surfaces of a single substrate. More specifically, the transmitting resonator and the first wiring may be provided on one surface of a substrate, and the receiving resonator, the second wiring, and the third wiring may be provided on the other surface of the substrate.

Hereinbefore the electromagnetic resonance coupler according to an aspect of the present disclosure has been described based on non-limiting and exemplary embodiments.

An electromagnetic resonance coupler which operates as a miniaturized single-ended to differential converter is achievable by implementing one or more of the exemplary embodiments or features disclosed herein. With the electromagnetic resonance coupler according to one non-limiting and exemplary embodiment, it is possible to transmit a signal with substantially low loss according to the nature of the electromagnetic resonance coupler. Moreover, it is possible to insulate both the ground which indicates the reference potential of input signals and the ground which indicates the reference potential of output signals, and transmit signals.

The herein disclosed subject matter is to be considered descriptive and illustrative only, and the appended Claims are of a scope intended to cover and encompass not only the particular embodiment(s) disclosed, but also equivalent structures, methods, and/or uses.

INDUSTRIAL APPLICABILITY

The electromagnetic resonance coupler apparatus according to one or more exemplary embodiments or features disclosed herein can be used as a miniaturized, low-loss high frequency signal distributor and coupler, and is applicable to converters which convert between single-ended signals and differential signals, for example.

The invention claimed is:

1. An electromagnetic resonance coupler for transmitting a high frequency signal between first resonant wiring and second resonant wiring wirelessly, the electromagnetic resonance coupler comprising:
a first substrate;
a second substrate facing the first substrate;
the first resonant wiring provided on the first substrate and having an open loop shape having an opening;
first input/output wiring provided on the first substrate and connected to a first connection point on the first resonant wiring;
the second resonant wiring provided on the second substrate and having a same wiring width and shape as a wiring width and shape of the first resonant wiring;
second input/output wiring provided on the second substrate and connected to a second connection point positioned on the second resonant wiring a predetermined distance away from a first end of the second resonant wiring; and
third input/output wiring provided on the second substrate and connected to a third connection point positioned on the second resonant wiring the predetermined distance away from a second end of the second resonant wiring,
wherein when viewed in a direction perpendicular to a main surface of the first substrate, the first resonant wiring and the second resonant wiring are symmetric about a point and have matching contours, and
when the high frequency signal is inputted to the electromagnetic resonance coupler, an electrical energy level at the second connection point and the third connection point is half an electrical energy level at a position on the second resonant wiring overlapping the first connection point.

2. The electromagnetic resonance coupler according to claim 1,
wherein the first connection point is positioned one quarter of a wiring length of the first resonant wiring away from a first end of the first resonant wiring,
the second connection point is positioned three-eighths of a wiring length of the second resonant wiring away from the first end of the second resonant wiring, and
the third connection point is positioned three-eighths of a wiring length of the second resonant wiring away from the second end of the second resonant wiring.

3. The electromagnetic resonance coupler according to claim 1,
wherein the first resonant wiring and the second resonant wiring each have a wiring length corresponding to a half wavelength of the high frequency signal in the first resonant wiring and the second resonant wiring.

4. The electromagnetic resonance coupler according to claim 1,
wherein the loop shape is circular.

5. The electromagnetic resonance coupler according to claim 1,
wherein the loop shape is rectangular.

6. The electromagnetic resonance coupler according to claim 1,
wherein the loop shape is a shape having at least five bends.

7. The electromagnetic resonance coupler according to claim 1,
wherein the first resonant wiring and the second resonant wiring are spaced apart in the direction perpendicular to the main surface of the first substrate by a distance of at most a half wavelength of the high frequency signal.

8. The electromagnetic resonance coupler according to claim 1, further comprising
ground wiring provided either on a surface of the first substrate not provided with the first resonant wiring, or on a surface of the second substrate not provided with the second resonant wiring, the ground wiring indicating a reference potential of the high frequency signal.

9. The electromagnetic resonance coupler according to claim 1, further comprising
ground wiring provided on the first substrate at a periphery of the first resonant wiring and the first input/output wiring, and on the second substrate at a periphery of the second resonant wiring, the second input/output wiring, and the third input/output wiring, the ground wiring indicating a reference potential of the high frequency signal.

10. The electromagnetic resonance coupler according to claim 1,
wherein the second resonant wiring is either connected to wiring connected to a midpoint of the second connection point and the third connection point, or connected, with a via, to ground wiring indicating a reference potential of the high frequency signal.

11. The electromagnetic resonance coupler according to claim 1, further comprising:
a cover substrate placed over either the first substrate or the second substrate; and
ground wiring provided on the cover substrate on a surface thereof not facing a one of the first substrate and the second substrate, the ground wiring indicating a reference potential of the high frequency signal.

12. The electromagnetic resonance coupler according to claim 1,
wherein the first substrate and the second substrate are a single substrate,
the first resonant wiring and the first input/output wiring are provided on a first surface of the substrate, and
the second resonant wiring, the second input/output wiring, and the third input/output wiring are provided on a second surface of the substrate.

* * * * *